(12) United States Patent
Norimatsu et al.

(10) Patent No.: US 10,494,737 B2
(45) Date of Patent: Dec. 3, 2019

(54) APPARATUS FOR PRODUCING SIC EPITAXIAL WAFER AND METHOD FOR PRODUCING SIC EPITAXIAL WAFER

(71) Applicant: SHOWA DENKO K.K., Tokyo (JP)

(72) Inventors: Jun Norimatsu, Yokohama (JP); Akira Miyasaka, Chichibu (JP); Yoshiaki Kageshima, Yokohama (JP)

(73) Assignee: SHOWA DENKO K.K., Tokyo (JP)

( * ) Notice: Subject to any disclaimer, the term of this patent is extended or adjusted under 35 U.S.C. 154(b) by 144 days.

(21) Appl. No.: 15/102,314

(22) PCT Filed: Oct. 30, 2014

(86) PCT No.: PCT/JP2014/078937
§ 371 (c)(1),
(2) Date: Jun. 7, 2016

(87) PCT Pub. No.: WO2015/098283
PCT Pub. Date: Jul. 2, 2015

(65) Prior Publication Data
US 2016/0312381 A1 Oct. 27, 2016

(30) Foreign Application Priority Data

Dec. 24, 2013 (JP) .................. 2013-266010

(51) Int. Cl.
*H01L 21/68* (2006.01)
*C30B 25/12* (2006.01)
(Continued)

(52) U.S. Cl.
CPC ............ *C30B 25/12* (2013.01); *C23C 16/325* (2013.01); *C23C 16/4584* (2013.01);
(Continued)

(58) Field of Classification Search
CPC ......... H01L 21/68735; H01L 21/68764; H01L 21/02378; C30B 25/12; C30B 31/14
See application file for complete search history.

(56) References Cited

U.S. PATENT DOCUMENTS 5,820,686 A * 10/1998 Moore ................ C23C 16/4581
118/500
6,099,650 A * 8/2000 Carbonaro ............. C23C 16/46
117/200
(Continued)

FOREIGN PATENT DOCUMENTS

CN 102747418 A 10/2012
CN 103074607 A 5/2013
(Continued)

OTHER PUBLICATIONS

International Search Report for PCT/JP2014/078937 dated Jan. 20, 2015.
(Continued)

*Primary Examiner* — Matthew J Song
(74) *Attorney, Agent, or Firm* — Sughrue Mion, PLLC

(57) ABSTRACT

The SiC epitaxial wafer-producing apparatus according to the invention includes a mounting plate having a concave accommodation portion, a satellite that is provided in the concave accommodation portion and has an upper surface on which a SiC substrate is placed, and a carbon member that is provided in the concave accommodation portion at a position which is lower than the SiC substrate and does not come into contact with the SiC substrate.

9 Claims, 10 Drawing Sheets

(51) Int. Cl.

| | | |
|---|---|---|
| *C30B 25/16* | (2006.01) | |
| *C30B 25/20* | (2006.01) | |
| *C30B 29/36* | (2006.01) | |
| *H01L 21/687* | (2006.01) | |
| *H01L 21/02* | (2006.01) | |
| *C23C 16/32* | (2006.01) | |
| *C23C 16/455* | (2006.01) | |
| *C23C 16/458* | (2006.01) | |
| *C30B 25/14* | (2006.01) | |
| *C30B 31/14* | (2006.01) | |

(52) U.S. Cl.
CPC ........ *C23C 16/45508* (2013.01); *C30B 25/14* (2013.01); *C30B 25/165* (2013.01); *C30B 25/20* (2013.01); *C30B 29/36* (2013.01); *H01L 21/0262* (2013.01); *H01L 21/02378* (2013.01); *H01L 21/02529* (2013.01); *H01L 21/68735* (2013.01); *H01L 21/68764* (2013.01); *H01L 21/68771* (2013.01); *C30B 31/14* (2013.01)

(56) References Cited

U.S. PATENT DOCUMENTS

| | | | | |
|---|---|---|---|---|
| 2003/0221624 | A1* | 12/2003 | Jurgensen | ........... C23C 16/4584 118/725 |
| 2004/0187790 | A1* | 9/2004 | Bader | ................. C23C 16/4581 118/728 |
| 2005/0022746 | A1* | 2/2005 | Lampe | ................ C23C 16/4581 118/728 |
| 2008/0035632 | A1* | 2/2008 | Fujita | ................. C23C 16/4581 219/634 |
| 2009/0075409 | A1* | 3/2009 | Ueno | ................ H01L 21/67103 438/22 |
| 2010/0092666 | A1 | 4/2010 | Morisaki et al. | |
| 2010/0273320 | A1* | 10/2010 | Kappeler | ............ C23C 16/4584 438/507 |
| 2012/0180726 | A1* | 7/2012 | Han | .................... C23C 16/4584 118/728 |
| 2013/0109192 | A1* | 5/2013 | Hawkins | ........... C23C 16/45521 438/758 |
| 2014/0230722 | A1* | 8/2014 | Kageshima | ............. C30B 29/36 117/88 |
| 2014/0273505 | A1* | 9/2014 | Hsieh | ................ H01L 21/68735 438/758 |
| 2016/0201219 | A1* | 7/2016 | Corea | .................... C30B 25/12 117/88 |

FOREIGN PATENT DOCUMENTS

| | | |
|---|---|---|
| CN | 103225072 A | 7/2013 |
| JP | 10-513146 A | 12/1998 |
| JP | 2004-507619 A | 3/2004 |
| JP | 2005-508097 A | 3/2005 |
| JP | 2006-028625 A | 2/2006 |
| JP | 2008-159947 A | 7/2008 |
| JP | 2008-270682 A | 11/2008 |
| JP | 2010-150101 A | 7/2010 |
| JP | 2013-038152 A | 2/2013 |
| JP | 2013-038153 A | 2/2013 |
| JP | 2013-507776 A | 3/2013 |
| WO | 96/23913 A1 | 8/1996 |
| WO | 03/039195 A2 | 5/2003 |
| WO | 2011/044412 A1 | 4/2011 |
| WO | 03/039195 A2 | 5/2013 |

OTHER PUBLICATIONS

Communication dated Jan. 17, 2018, from the State Intellectual Property Office of People's Republic of China in counterpart Application No. 201480070027.6.

* cited by examiner

APPARATUS FOR PRODUCING SIC EPITAXIAL WAFER AND METHOD FOR PRODUCING SIC EPITAXIAL WAFER

CROSS REFERENCE TO RELATED APPLICATIONS

This application is a National Stage of International Application No. PCT/JP2014/078937 filed Oct. 30, 2014, claiming priority based on Japanese Patent Application No. 2013-266010 filed Dec. 24, 2013, the contents of all of which are incorporated herein by reference in their entirety.

TECHNICAL FIELD

The present invention relates to a SiC epitaxial wafer-producing apparatus and a SiC epitaxial wafer-producing method.

BACKGROUND ART

Silicon carbide (SiC) is characterized in that a breakdown electric field is one digit greater than that of silicon (Si), and a band gap and thermal conductivity are about three times more than those of Si. Therefore, silicon carbide (SiC) is expected to be applied to, for example, power devices, high-frequency devices, and devices that operate at a high temperature. In recent years, the SiC epitaxial wafer has been used in the above-mentioned semiconductor devices.

A SiC epitaxial wafer is produced by a SiC single crystal substrate on which a SiC epitaxial film is formed, and SiC single crystal substrate is obtained by processing a SiC bulk single crystal manufactured by, for example, a sublimation method. In general, the SiC epitaxial wafer is produced by growing a SiC epitaxial film serving as an active region of a SiC semiconductor device on a SiC single crystal substrate, using a chemical vapor deposition (CVD) method.

A horizontal rotating and revolving epitaxial growth apparatus (see a SiC epitaxial wafer-producing apparatus illustrated in FIG. 1) which horizontally arranges a plurality of wafers and rotates each wafer on its axis while revolving the wafer is given as an example of an apparatus for producing the SiC epitaxial wafer. In general, in the epitaxial growth apparatus, a plurality of satellites which are SiC single crystal substrate-mounting portions and are made of graphite are provided on a rotatable mounting plate (susceptor) made of graphite so as to surround a rotating shaft of the mounting plate. A disk-shaped ceiling made of graphite is provided above the mounting plate and the satellites. A gas supply portion for supplying a raw material gas onto the SiC single crystal substrate is provided at the center of the ceiling. Since the satellite can be rotated on its axis by a rotating mechanism, the SiC single crystal substrate placed on the satellite is configured such that it can revolve on its axis and around the rotating shaft of the mounting plate. Therefore, the SiC single crystal substrate placed on the satellite can revolve around the rotating shaft of the mounting plate and rotate on its axis.

In the above-mentioned epitaxial growth apparatus, the raw material gas is supplied from the gas supply portion so as to pass through the upper surface of the SiC single crystal substrate placed on the mounting plate from the outer circumferential end of the SiC single crystal substrate. At that time, an epitaxial material is deposited on the substrate while the SiC single crystal substrate is maintained at a high temperature by heating means. In this way, an epitaxial film is formed.

However, in this apparatus, in general, each member, such as the mounting plate (susceptor) or the satellite made of graphite, is exposed to a high temperature. Therefore, each member is coated with a film, such as a TaC film, in order to prevent deposition caused by graphite in the epitaxial film. For example, PTL 1 and PTL 2 disclose a technique which coats the surface of a member of an epitaxial growth furnace made of graphite with SiC or TaC. PTL 3 and PTL 4 disclose a technique in which a satellite is preferably used as a portion of a susceptor and the surface of the satellite is coated with, for example, SiC or TaC. PTL 5 to PTL 7 disclose a technique which coats a portion of a member made of graphite in order to protect the member.

CITATION LIST

Patent Literature

[PTL 1] Japanese Unexamined Patent Application, First Publication No. 2010-150101
[PTL 2] Published Japanese Translation No. 2004-507619 of the PCT International Publication
[PTL 3] Japanese Unexamined Patent Application, First Publication No. 2013-38152
[PTL 4] Japanese Unexamined Patent Application, First Publication No. 2013-38153
[PTL 5] Published Japanese Translation No. 2005-508097 of the PCT International Publication
[PTL 6] Japanese Unexamined Patent Application, First Publication No. 2008-270682
[PTL 7] Published Japanese Translation No. H10-513146 of the PCT International Publication

SUMMARY OF INVENTION

Technical Problem

When a SiC epitaxial film is grown on a SiC single crystal substrate, there is a problem in that the carrier concentration is too high in an outer circumferential portion of the SiC epitaxial film, that is, in the vicinity of the edge and a variation in the carrier concentration in the surface of the SiC epitaxial film is large.

The inventors conducted a thorough study on the cause of the variation in carrier concentration. As a result, the inventors found that the cause was due to a large difference between the decomposition speeds of propane ($C_3H_8$) and a silane-based gas ($SiH_4$), which were generally used as raw material gases for forming the SiC epitaxial film.

It is known that the decomposition speed of $C_3H_8$ including carbon is lower than that of $SiH_4$. When a raw material gas is supplied onto the SiC single crystal substrate during epitaxial growth, the outer circumferential end of the SiC single crystal substrate is close to a gas inlet (the upstream side of the flow of gas) since the SiC single crystal substrate is rotated on its axis. That is, when the SiC epitaxial film is grown with the supply of the raw material gas, $C_3H_8$ including carbon is not sufficiently decomposed in the vicinity of the outer circumferential portion of the SiC single crystal substrate which is on the upstream side of the flow of gas. As a result, the amount of carbon included in the grown film is reduced. In contrast, $C_3H_8$ including carbon is sufficiently decomposed in the vicinity of the center of the substrate which is on the downstream side and the percentage of carbon in the vicinity of the center is relatively higher than that of carbon in the vicinity of the outer circumferential portion.

The ratio of C/Si in the supplied raw material gas is set on the assumption that propane ($C_3H_8$) and a silane-based gas ($SiH_4$) are sufficiently decomposed. Therefore, when there is a difference between the decomposition speeds, the ratio of C/Si in the outer circumferential portion of the SiC epitaxial film is relatively low. That is, the carrier concentration in the surface of the SiC epitaxial film is appropriately controlled in the vicinity of the center of the substrate where gas is sufficiently decomposed. However, the ratio of C/Si is low in the outer circumferential portion and the carrier concentration is high.

The reason why the ratio of C/Si is low in the outer circumferential portion and the carrier concentration is high in the outer circumferential portion will be described. During SiC epitaxial growth, N is generally used as a carrier. N is selectively introduced to a site occupied by carbon atoms. When the ratio of C/Si is low, the relative amount of carbon in the raw material gas is small. Therefore, N serving as a carrier is likely to enter the site occupied by carbon in a SiC film that is epitaxially grown. That is, the amount of N introduced as a carrier increases and the carrier concentration increases. Therefore, the method according to the related art has a problem in that the carrier concentration in the outer circumferential portion of the SiC epitaxial film is high and a variation in the carrier concentration is large.

Here, the amount of carbon in the outer circumferential portion is insufficient and the carrier concentration is reduced. Therefore, in order to increase the carbon concentration of the raw material gas, for example, a method is considered which increases the ratio of C/Si in the outer circumferential portion of the SiC epitaxial film. However, it is difficult to suppress a variation in the ratio of C/Si at the center and the difference in carrier concentration between the center and the outer circumferential portion of the wafer only by increasing the carbon concentration.

As described above, an apparatus which suppresses a variation in the carrier concentration in the surface of the SiC single crystal substrate that occurs when the SiC epitaxial film is grown on the SiC single crystal substrate has not been proposed. Therefore, an apparatus and a method which can effectively uniformize the carrier concentration in the surface of a SiC epitaxial film grown on a SiC single crystal substrate, without increasing the number of processes or costs, are sorely needed.

The invention has been made in view of the above-mentioned problems and an object of the invention is to provide a SiC epitaxial wafer-producing apparatus which can uniformize the carrier concentration in the surface of a wafer with a simple structure and has high production quality and high productivity, and a SiC epitaxial wafer.

Solution to Problem

The inventors conducted a thorough study on a technique for suppressing the variation in carrier concentration in the surface of the SiC epitaxial film of the SiC epitaxial wafer. As a result, the inventors found that, since the decomposition speed of a carbon hydride-based gas was lower than that of a silane-based gas in the raw material gas used to grow the SiC epitaxial film, the carrier concentration in the outer circumferential portion of the wafer was higher than that at the center of the wafer due to a reduction in the ratio of C/Si in the outer circumferential portion of the wafer which was on the upstream side of the flow of the raw material gas. That is, the inventors considered that, when a structure for supplementing carbon was provided in the vicinity of the outer circumferential portion of the wafer, it was possible to suppress a variation in the carrier concentration.

As a method for increasing only the carbon concentration in the vicinity of the outer circumferential portion, the following method has been considered: a satellite 500 in which a base 501 made of graphite is covered with a coating film 502 made of, for example, TaC is configured such that the base 501 is exposed, as illustrated in FIG. 10. That is, the following structure is considered: as in a satellite 600 illustrated in FIG. 11, graphite which is a base 601 is completely exposed. In this case, carbon can be emitted from the satellite 600 by heat during epitaxial growth and can be supplied to a raw material gas.

However, as illustrated in FIG. 11, in a case in which the satellite 600 including the base 601 which is graphite and of which the surface is not coated is used, a rear surface 11*b* of a SiC single crystal substrate 11 placed on the satellite 600 comes into direct contact with the graphite base. As a result, the rear surface 11*b* of the SiC single crystal substrate 11 is roughened. This makes it difficult to obtain electrical characteristics which are expected from the excellent physical properties of the SiC epitaxial wafer in a case in which various devices are produced in the subsequent process. In addition, there is a concern that, for example, an error in the suction of the substrate will occur in an inspection process. In a case in which a member in which a graphite material is completely exposed is used, when the SiC single crystal substrate comes into contact with the graphite material, there is a concern that graphite particles generated during the contact will be attached to the surface of the SiC epitaxial film and the state of the surface will deteriorate. For this reason, only the structure in which a coating process is not performed for the base of the satellite and graphite is exposed from the entire satellite is insufficient to solve the above-mentioned problems. Of course, it is difficult to solve the problems only by stopping coating with TaC or SiC required for the CVD growth of SiC.

In addition, the inventors found that, when a carbon member was provided at a specific position as detailed means for supplementing a reduction in the ratio of C/Si during the growth of a SiC epitaxial film, it was possible to suppress a variation in carrier concentration in the surface of the wafer. As a result, the invention was achieved.

That is, the invention provides the following means in order to solve the above-mentioned problems.

(1) A SiC epitaxial wafer-producing apparatus is provided that grows a SiC epitaxial film on a main surface of a SiC substrate using a chemical vapor deposition method. The SiC epitaxial wafer-producing apparatus includes: a mounting plate that has a concave accommodation portion; a satellite that is provided in the concave accommodation portion and has an upper surface on which the SiC substrate is placed; and a carbon member that is provided in the concave accommodation portion at a position which is lower than the SiC substrate and does not come into contact with the SiC substrate.

(2) The SiC epitaxial wafer-producing apparatus according to (1) may further include a substrate-holding ring that has an opening portion having substantially the same size as the SiC substrate and is provided so as to surround a side surface of the SiC substrate. The carbon member may be a ring-shaped member that is provided below the substrate-holding ring.

(3) In the SiC epitaxial wafer-producing apparatus according to (1), the carbon member may be provided on the bottom of the concave accommodation portion.

(4) A SiC epitaxial wafer-producing apparatus is provided that grows a SiC epitaxial film on a main surface of a SiC substrate using a chemical vapor deposition method. The SiC epitaxial wafer-producing apparatus includes: a mounting plate that has a concave accommodation portion; and a satellite that is provided in the concave accommodation portion and has an upper surface on which the SiC substrate is placed. The satellite includes a carbon base which is covered with a non-carbon material and a portion which is provided at a position that does not come into contact with the SiC substrate placed on the satellite and through which the carbon base is exposed.

(5) In the SiC epitaxial wafer-producing apparatus according to (4), the satellite may include a counterbored portion which is formed in a central portion of an upper surface thereof so as not to come into contact with the SiC substrate and a supporting portion which is provided so as to surround the counterbored portion and support the SiC substrate. The carbon base may be exposed through at least a portion of the bottom of the counterbored portion and the at least portion of the bottom may be the portion through which the carbon base is exposed.

(6) In the SiC epitaxial wafer-producing apparatus according to (4) or (5), the carbon base may be exposed through at least a portion of a rear surface of the satellite and the at least portion of the rear surface may be the portion through which the carbon base is exposed.

(7) A SiC epitaxial wafer-producing apparatus is provided that grows a SiC epitaxial film on a main surface of a SiC substrate using a chemical vapor deposition method. The SiC epitaxial wafer-producing apparatus includes: a mounting plate that has a concave accommodation portion; a satellite that is provided in the concave accommodation portion and has an upper surface on which the SiC substrate is placed; a raw material gas introduction pipe that is used to supply a raw material gas for the SiC epitaxial film onto the main surface of the SiC substrate placed on the satellite; and a carbon member that is provided on an upstream side of the flow of the raw material gas between a gas inlet of the raw material gas introduction pipe and the satellite.

(8) The SiC epitaxial wafer-producing apparatus according to (7) may further include a plurality of cover members that cover an upper surface of the mounting plate. Some of the plurality of cover members may be made of carbon and may form the carbon member.

(9) A SiC epitaxial wafer-producing apparatus is provided that grows a SiC epitaxial film on a main surface of a SiC substrate using a chemical vapor deposition method. The SiC epitaxial wafer-producing apparatus includes: a mounting plate that has a concave accommodation portion; a satellite that is provided in the concave accommodation portion and has an upper surface on which the SiC substrate is placed; and a substrate-holding ring that has an opening portion having substantially the same size as the SiC substrate, is provided so as to surround a side surface of the SiC substrate, and is made of a carbon material.

(10) A SiC epitaxial wafer-producing method is provided, including: providing the carbon member, the carbon base, or the substrate-holding ring made of the carbon material according to any one of (1) to (9) in a SiC epitaxial wafer-producing apparatus and producing a SiC epitaxial wafer.

Advantageous Effects of Invention

The SiC epitaxial wafer-producing apparatus according to the invention has a structure in which a carbon member for supplying carbon is provided at a specific position. Carbon is supplied from an outer circumferential portion of a SiC epitaxial film grown on a SiC substrate, separately from a raw material gas, to increase the ratio of C/Si in the outer circumferential portion of the SiC epitaxial film. Therefore, it is possible to suppress a variation in carrier concentration in the surface of the SiC epitaxial film. As a result, it is possible to effectively uniformize the carrier concentration in the surface of a wafer, using an apparatus with a simple structure, and to produce a SiC epitaxial wafer having excellent electrical characteristics with high productivity.

According to the SiC epitaxial wafer-producing method of the invention, it is possible to control the effective ratio of C/Si to improve a carrier concentration distribution in the surface of a wafer. Therefore, it is possible to produce an epitaxial wafer suitable for manufacturing devices with excellent electrical characteristics.

BRIEF DESCRIPTION OF DRAWINGS

FIG. 2A is a cross-sectional view illustrating a satellite portion (a portion including neighboring components, such as a satellite and a substrate-holding ring) in which a SiC substrate is placed on the satellite and FIG. 2B is a plan view illustrating the satellite portion.

FIG. 3A is a cross-sectional view illustrating a concave accommodation portion of a susceptor and a satellite portion in which a SiC substrate is placed on a satellite and FIG. 3B is a plan view illustrating the satellite portion.

FIG. 4A is a cross-sectional view illustrating a satellite portion in which a SiC substrate is placed on a satellite and FIG. 4B is a plan view illustrating the satellite portion.

FIG. 5A is a plan view illustrating a front surface of a satellite and FIG. 5B is a plan view illustrating a rear surface of the satellite.

FIG. 8A is a graph illustrating a carrier concentration distribution of a SiC epitaxial wafer in a radial direction and FIG. 8B is a graph illustrating the ratio of the carrier concentration of the SiC epitaxial wafer in the radial direction to the carrier concentration at the center of the wafer.

FIG. 9A is a graph illustrating a carrier concentration distribution of a SiC epitaxial wafer in a radial direction and FIG. 9B is a graph illustrating the ratio of the carrier concentration of the SiC epitaxial wafer in the radial direction to the carrier concentration at the center of the wafer.

DESCRIPTION OF EMBODIMENTS

Figure 1:
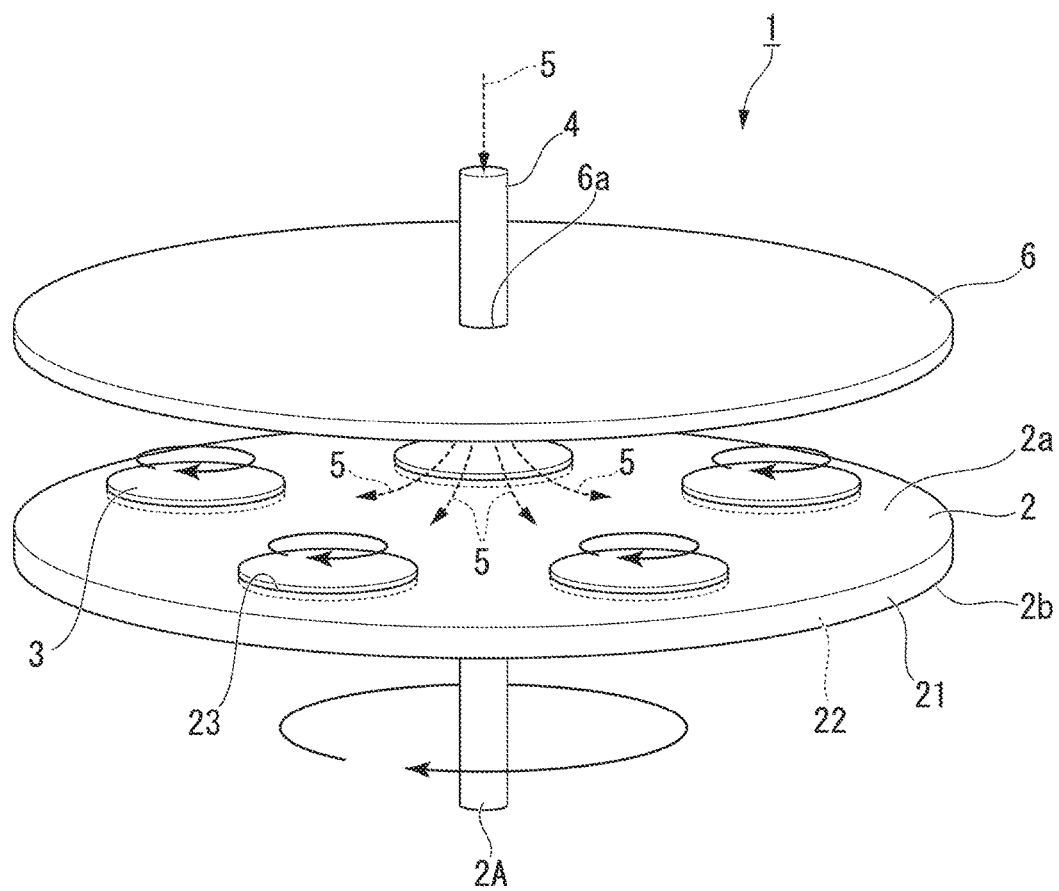
FIG. 1 is a diagram schematically illustrating an example of a SiC epitaxial wafer-producing apparatus according to an embodiment of the invention which grows a SiC epitaxial film on a main surface of a SiC substrate using a CVD method.

Hereinafter, a SiC epitaxial wafer-producing apparatus and a SiC epitaxial wafer-producing method according to the invention will be described in detail while appropriately referring to the drawings.

In the drawings used in the following description, in some cases, characteristic portions are enlarged for ease of understanding of the characteristics of the invention and the dimensions and scale of each component are different from the actual dimensions and scale. For example, materials and dimensions exemplified in the following description are illustrative and the invention is not limited thereto. The materials and dimensions can be appropriately changed without departing from the scope and spirit of the invention.

<SiC Epitaxial Wafer-producing Apparatus>
(First Embodiment)

An example of a SiC epitaxial wafer-producing apparatus according to a first embodiment of the invention will be described below.

Figure 2A:
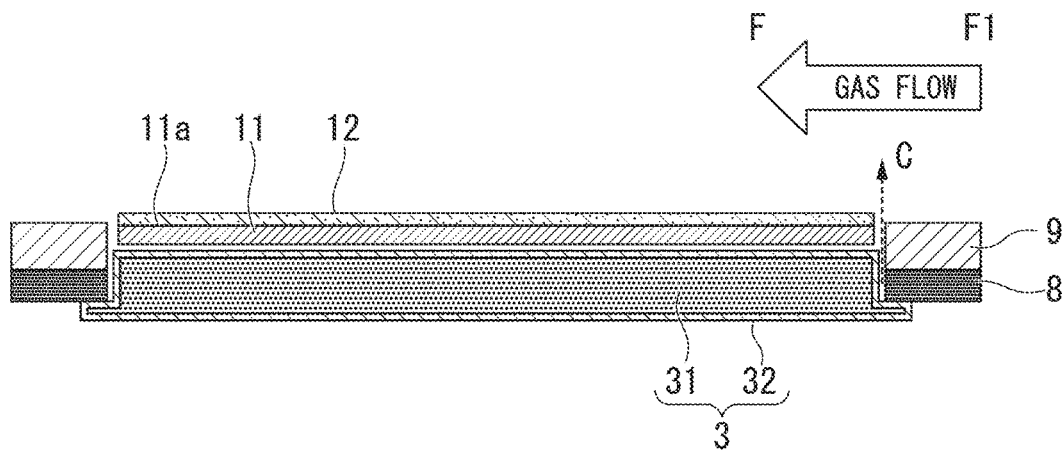
FIGS. 2A and 2B are diagrams schematically illustrating an example of the arrangement of a carbon member provided in a SiC epitaxial wafer-producing apparatus according to a first embodiment of the invention.

As illustrated in FIGS. 1 and 2(a), a producing apparatus 1 according to the first embodiment is an apparatus that grows a SiC epitaxial film 12 on a main surface 11a of a SiC substrate 11, using a chemical vapor deposition method, and is a horizontal rotating and revolving epitaxial growth apparatus in which a plurality of wafers (SiC substrates) are horizontally arranged and each wafer is revolved while being rotated on its center, as in the example illustrated in the drawings.

The SiC epitaxial wafer-producing apparatus 1 according to the first embodiment includes a mounting plate 2 having a concave accommodation portion 23 (see FIGS. 3A and 3B), a satellite 3 that is provided in the concave accommodation portion 23 and has an upper surface on which the SiC substrate 11 is placed, and a carbon member 8 that is provided in the concave accommodation portion 23 at a position that is lower than the SiC substrate 11 and does not come into contact with the SiC substrate 11.

In the example illustrated in FIGS. 2A and 2B, the carbon member 8 is a ring-shaped member that is provided below a substrate-holding ring 9. The substrate-holding ring 9 is provided in the vicinity of the SiC substrate 11 in order to hold the SiC substrate 11 from the side.

A ceiling 6 is provided above the mounting plate 2 and the satellite 3. A raw material gas introduction pipe 4 for supplying a raw material gas 5 onto the main surface 11a of the SiC substrate 11 placed on the satellite 3 is provided in the ceiling 6 so as to pass through a central portion 6a. In the example illustrated in the drawings, a rotating shaft 2A of the susceptor 2 is provided immediately below the raw material gas introduction pipe 4. The rotating shaft 2A is provided coaxially with the raw material gas introduction pipe 4.

The raw material gas 5 is configured such that it is supplied from the raw material gas introduction pipe 4 to the center of the apparatus and flows to an outer circumferential portion of the apparatus.

The mounting plate 2 is a disk-shaped member obtained by forming a coating film 22 on the surface of a base 21 made of graphite. A plurality of concave accommodation portions 23 for holding the satellites 3 are provided in an upper surface 2a of the mounting plate 2 so as to surround the rotating shaft 2A. The rotating shaft 2A which is driven by a driving mechanism (not illustrated) to rotate the susceptor is provided on a lower surface 2b of the mounting plate 2.

The coating film 22 formed on the surface of the mounting plate 2 can be made of a known material such as TaC or SiC.

Similarly to the mounting plate 2, the satellite 3 is a disk-shaped member obtained by forming a coating film 32 on the surface of a base 31 made of graphite. Similarly to the mounting plate 2, the coating film 32 formed on the surface of the satellite 3 can be made of a known material such as TaC or SiC.

The satellite 3 is accommodated in the concave accommodation portion 23 provided in the upper surface 2a of the mounting plate 2 and can be rotated on its axis by a rotating mechanism (not illustrated). Therefore, the satellite 3 is revolved around the rotating shaft 2A of the mounting plate 2 while being rotated on its axis to revolve the SiC substrate 11 on its axis and around the rotating shaft 2A.

The ceiling 6 is provided so as to cover the mounting plate 2 and the satellite 3 from the upper side. A reaction space is formed between the ceiling 6, and the mounting plate 2 and the satellite 3.

Similarly to the mounting plate 2 and the satellite 3, the ceiling 6 is a disk-shaped member obtained by forming a coating film on the surface of a base made of graphite. Similarly to the mounting plate 2, the coating film formed on the surface of the ceiling 6 can be made of a known material such as TaC or SiC.

As described above, the raw material gas introduction pipe 4 is provided in the central portion 6a of the ceiling 6.

A raw material gas is introduced into the raw material gas introduction pipe 4 from an external duct (not illustrated). The raw material gas flows to a space between the ceiling 6, and the mounting plate 2 and the satellite 3. As a result, the raw material gas 5 is supplied onto the main surface 11a of the SiC substrate 11. Gas including a carbon hydride-based gas and a silane-based gas, which are generally used as a raw material for forming a SiC epitaxial film, can be used as the raw material gas 5. Specifically, $C_3H_8$ can be used as the carbon hydride-based gas and $SiH_4$ can be used as the silane-based gas.

As in the example illustrated in FIG. 2A, the carbon member 8 is located below the main surface 11a of the SiC substrate 11 so as not to come into contact with the SiC substrate 11.

The structure in which the carbon member 8 is provided below the main surface 11a of the SiC substrate 11 makes it possible to prevent carbon from being attached to the main surface 11a of the SiC substrate 11 even in a case in which carbon is generated from graphite forming the carbon member 8 due to, for example, reaction with $H_2$ in a high-temperature atmosphere.

Since the carbon member 8 made of graphite is provided so as not to come into contact with the rear surface of the SiC substrate 11, it is possible to prevent the surface of the SiC substrate 11 from being roughened.

It is preferable that the carbon member 8 be provided at a position where it does not slide between other members in order to prevent particles from being generated.

It is preferable that the carbon member 8 be provided in a ring shape so as to surround the SiC substrate 11. When the carbon member 8 is provided in a ring shape so as to surround the SiC substrate 11, it is possible to uniformly supply carbon to the entire outer circumference of the SiC substrate 11 and to prevent a variation carrier concentration in the surface of the SiC substrate 11.

It is preferable that the surface of the carbon member 8 be covered so as not to come into direct contact with the raw material gas 5, as illustrated in FIG. 2A. When the epitaxial film 12 is formed on the SiC substrate 11, epitaxial growth is performed on the surface of the carbon member 8, which is located on the side of the raw material gas 5. Therefore, when no cover is provided on the surface of the carbon member 8, an epitaxial film is grown on the surface of the carbon member 8, which is located on the side of the raw material gas 5. As a result, the generation of carbon from the carbon member 8 is hindered and the supply efficiency of carbon changes over time.

The substrate-holding ring 9 is a member for preventing the SiC substrate 11 from skidding. The substrate-holding ring 9 is made of, for example, graphite which is coated with SiC or TaC in order to prevent carbon from being exposed or silicon carbide. As illustrated in FIG. 2A, in the first embodiment, the substrate-holding ring 9 also functions as a cover provided on the surface of the carbon member 8, which is located on the side of the raw material gas 5. In the example illustrated in FIGS. 2A and 2B, the substrate-holding ring 9 is provided on a step portion which is formed in the outer circumference of the satellite 3 and is lower than the upper surface, with the carbon member 8 interposed therebetween.

It is preferable that the substrate-holding ring 9 completely cover the surface of the carbon member 8, which is located on the side of the raw material gas 5, in order to prevent a change in the supply efficiency of carbon over time.

It is preferable that the substrate-holding ring 9 not completely come into close contact with the SiC substrate 11 and the satellite 3. When these members completely come into close contact with each other, it is difficult to sufficiently ensure the flow path of carbon generated from the carbon member 8 and to appropriately supply carbon to the side of the raw material gas 5.

Graphite forming the carbon member 8 is not particularly limited. For example, it is preferable to use high-purity graphite in order to prevent the generation of impurities other than carbon when carbon is generated by the reaction with hydrogen.

Figure 2B:
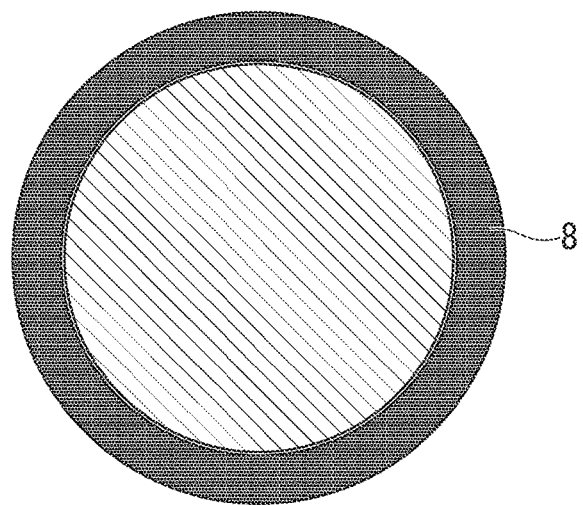
Figure 3A:
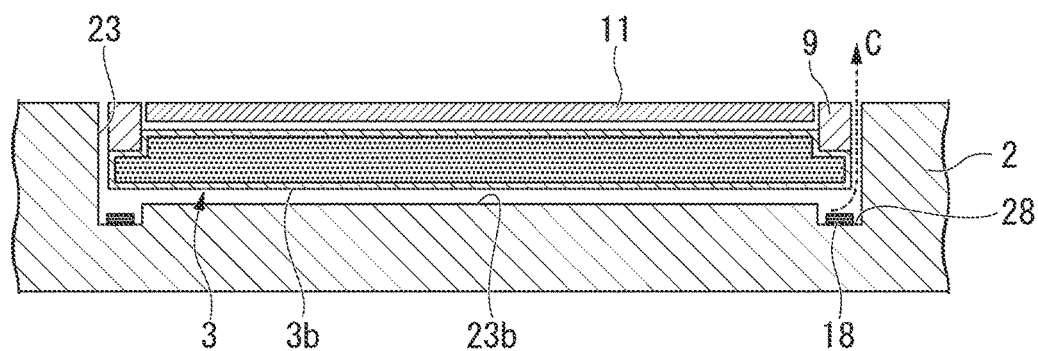
FIGS. 3A and 3B are diagrams schematically illustrating another example of the arrangement of the carbon member provided in the SiC epitaxial wafer-producing apparatus according to the first embodiment of the invention.
Figure 3B:
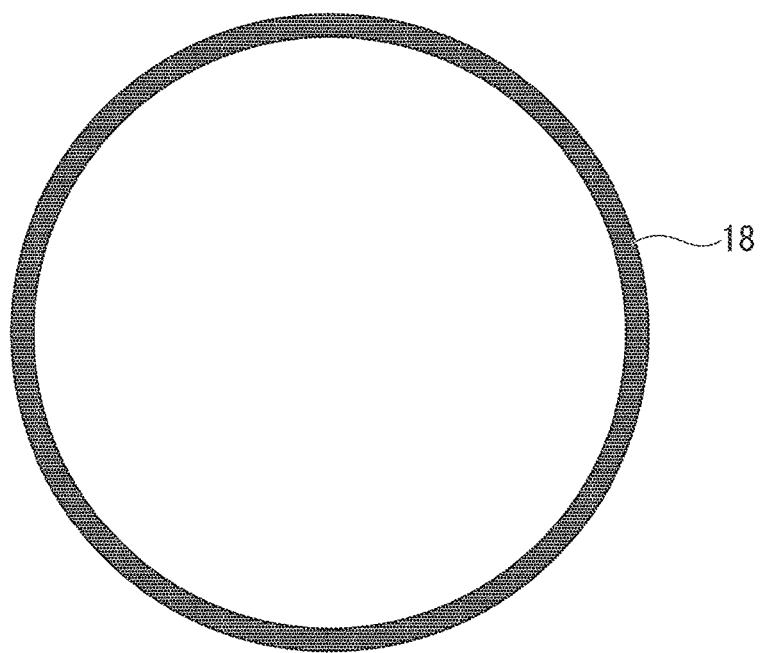

As an example other than the example illustrated in FIGS. 2A and 2B, as illustrated in FIGS. 3A and 3B, the carbon member may be provided on the bottom of the concave accommodation portion 23 in the mounting plate 2. It is preferable that a carbon member 18 be provided so as to surround an outer circumferential end of the satellite 3 in a plan view. When the carbon member is provided so as to surround the outer circumferential end of the satellite 3, it is possible to uniformly supply carbon to the outer circumference of the SiC substrate 11 and to prevent the carrier concentration in the surface of the SiC substrate 11 from being non-uniform.

The carbon member may be a C-shaped ring member, that is, an arc-shape ring member or may be an O-shaped ring member, as illustrated in FIG. 3B.

It is preferable that the carbon member 18 be provided at a position other than a sliding position when the satellite 3 is rotated on its axis in the concave accommodation portion 23.

Specifically, as illustrated in FIGS. 3A and 3B, a concave portion 28 which accommodates the carbon member 18 can be provided in the bottom 23b of the concave accommodation portion 23 in the mounting plate 2. In this structure, the carbon member 18 is provided in the concave portion 28 which is lower than the bottom 23b of the concave accommodation portion 23 which a lower surface 3b of the satellite 3 grazes when the satellite 3 is rotated on its axis. Therefore, it is possible to prevent the carbon member 18 from grazing the lower surface 3b of the satellite 3 and to suppress the generation of particles. For this reason, the height of the carbon member 18 is less than the depth of the concave portion 28.

In the example illustrated in FIGS. 3A and 3B, the substrate-holding ring 9 is provided in a step portion that is formed in the outer circumference of the satellite 3 and is lower than the upper surface.

The outside diameter of the satellite 3 is substantially equal to the inside diameter of the concave accommodation portion 23. It is preferable that the inside diameter of the concave accommodation portion 23 be slightly greater than the outside diameter of the satellite 3. If the size of the concave accommodation portion 23 is significantly greater than the size of the satellite 3, the satellite 3 skids when rotated on its axis, which makes it difficult to obtain a uniform SiC epitaxial film 12. On the other hand, if the satellite 3 and the concave accommodation portion 23 have the same size, it is difficult to sufficiently ensure the flow path of carbon which is generated from the carbon member 18 and is then supplied to the side of the raw material gas 5 and to appropriately supply carbon.

In the producing apparatus 1 according to the first embodiment, the raw material gas 5 is supplied downward from the raw material gas introduction pipe 4 so as to pass through the main surface 11a of the SiC substrate 11 from the outer circumferential end of the SiC substrate 11 placed on the satellite 3 (see FIG. 2A). Then, an epitaxial material is deposited on the SiC substrate 11 while the SiC substrate 11 is maintained at a high temperature by heating means, such as a high-frequency coil (not illustrated) provided below the susceptor 2. In this way, an epitaxial film is formed.

At that time, as illustrated in FIG. 2A, carbon (C) is generated from the carbon member 8 made of graphite by the heating process of the heating means (not illustrated). Then, the carbon is supplied to the upstream side of the flow of the raw material gas 5, that is, the F1 side of an arrow F illustrated in FIGS. 2A and 2B, to increase the ratio of C/Si on the upstream (F1) side of the SiC epitaxial film 12. Since the satellite 3 rotates on its axis, the upstream side of the gas flow on the SiC epitaxial film is the outer circumferential portion of the SiC substrate.

As described above, in general, a carbon hydride-based gas forming the raw material gas 5 has a lower decomposition speed than Si included in a silane-based gas. Therefore, C concentration tends to be reduced in the outer circumferential portion of the SiC epitaxial film 12 which is located at F1, that is, on the upstream side of the flow of the raw material gas 5.

In contrast, the producing apparatus 1 according to the invention has the above-mentioned structure including the carbon member 8, supplies carbon to the upstream side of the flow of the raw material gas 5 to increase the ratio of C/Si in the gas in the vicinity of the outer circumferential portion of the SiC epitaxial film 12, and grows the SiC epitaxial film 12. Therefore, it is possible to suppress a variation in the ratio of C/Si in the surface of the SiC epitaxial film 12 due to the difference between the decomposition speeds of components forming the raw material gas 5. As such, the dependence of the ratio of C/Si in gas in the entire surface of the SiC epitaxial film 12 on the position is reduced and a variation in the carrier concentration of the SiC epitaxial film 12 is reduced.

In the case of the rotating and revolving apparatus according to this embodiment, gas is spread from the center to the outer circumference of the mounting plate which is revolved and the raw material gas is decomposed and consumed. Therefore, the growth speed of the SiC epitaxial film is reduced toward the outer circumferential portion of the mounting plate. For this reason, when attention is paid to one end of the SiC substrate, the level of contribution of the raw material gas to growth at the center is higher than the level of contribution of the raw material gas to growth at the end. In a case in which the satellite is rotated on its axis, the growth speed is averaged to some degree. Under substantial growth conditions, of the central portion and the outer circumferential portion of the wafer, the outer circumferential portion of the wafer becomes the upstream side of the flow of gas.

(Second Embodiment)

A producing apparatus according to a second embodiment differs from the producing apparatus 1 according to the first embodiment only in the structure of the satellite and the other structures are the same as those of the producing apparatus 1 according to the first embodiment.

A satellite according to the second embodiment includes a carbon base which is covered with a non-carbon material and a portion which is provided at a position that does not come into contact with a SiC substrate placed on the satellite and through which the carbon base is exposed.

Figure 4A:
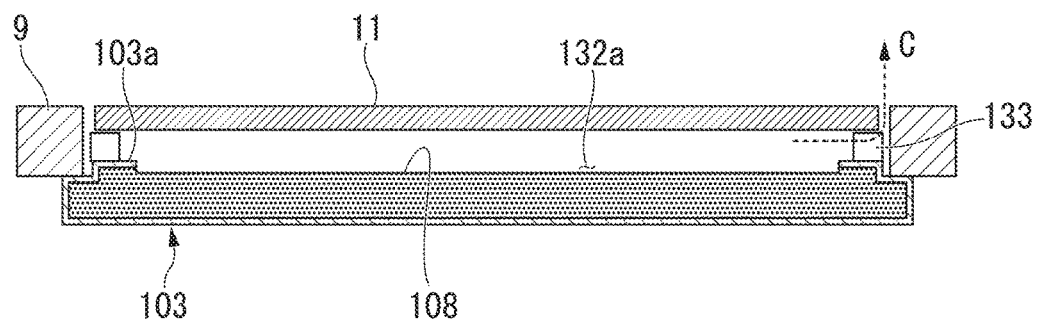
FIGS. 4A and 4B are diagrams is a diagram schematically illustrating an example of the arrangement of a carbon member provided in a SiC epitaxial wafer-producing apparatus according to a second embodiment of the invention.
Figure 4B:
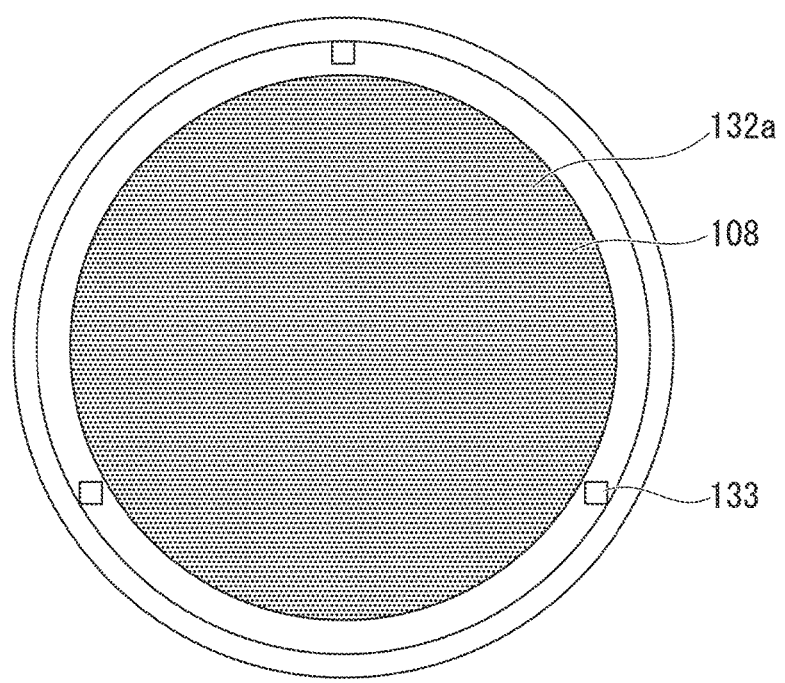

For example, as illustrated in FIGS. 4A and 4B, a satellite 103 includes a counterbored portion 132a that is formed in a central portion of an upper surface 103a of the satellite 103 so as not to come into contact with a SiC substrate 11 and a supporting portion 133 that is provided so as to surround the counterbored portion 132a and support the SiC substrate 11. A carbon base 108 is exposed through at least a portion of the bottom of the counterbored portion 132a.

The supporting portion 133 is used to prevent the direct contact between the carbon base 108 and the SiC substrate 11. Therefore, it is possible to prevent a rear surface of the SiC substrate 11 from being contaminated.

When the SiC substrate 11 is placed as illustrated in FIG. 4A, the carbon base 108 is in a space that is surrounded by the satellite 103, the SiC substrate 11, and the supporting portion 133. In this case, carbon that is generated from the carbon base 108 is confined in the space and it is difficult to appropriately supply carbon to the raw material gas 5. In order to solve the problem, it is preferable that the supporting portion 133 not be provided in the entire circumference of the counterbored portion 132a, but be discretely provided.

In the example illustrated in FIGS. 4A and 4B, a substrate-holding ring 9 is provided in a step portion that is formed in the outer circumference of the satellite 3 and is lower than the upper surface.

Figure 5A:
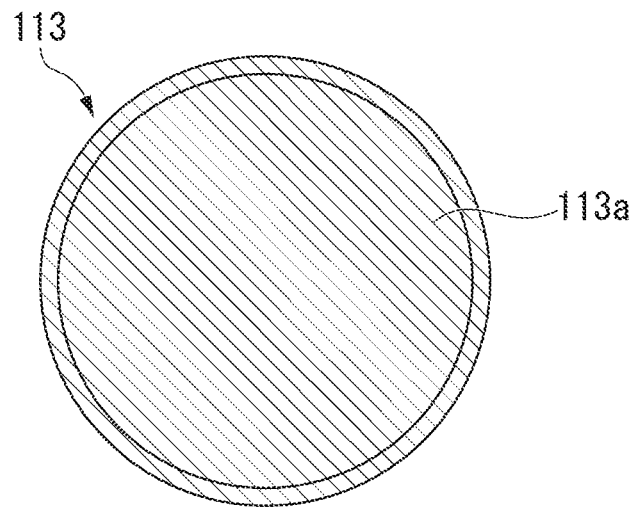
FIGS. 5A and 5B are diagrams is a diagram schematically illustrating another example of the arrangement of the carbon member provided in the SiC epitaxial wafer-producing apparatus according to the second embodiment of the invention.
Figure 5B:
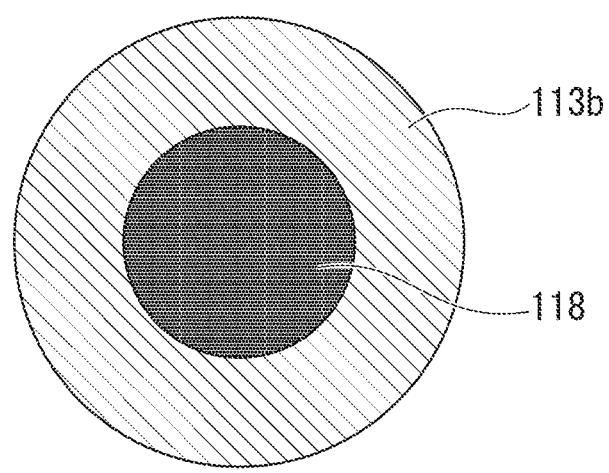

As illustrated in FIGS. 5A and 5B, a carbon base 118 may be exposed from at least one of a front surface 113a on which the SiC substrate 11 is placed and a rear surface 113b of the satellite 113 opposite to the front surface 113a.

In a case in which the carbon base 118 is exposed from the entire rear surface 113b of the satellite, it is considered that the carbon base 118 grazes when the satellite 113 rotates on its axis and particles are generated. Therefore, it is preferable that the entire rear surface 113b not be exposed. In a case in which the entire rear surface is not exposed, it is possible to prevent the carbon base 118 from grazing even if the satellite 113 is rotated on its axis since there is a difference in thickness corresponding to a coating film between the exposed carbon base 118 and the rear surface of the satellite 113. The counterbored portion and the supporting portion illustrated in FIGS. 4A and 4B may be provided in the rear surface 113b of the satellite 113 and the carbon base may be exposed through a portion of the counterbored portion.

In the first embodiment, the carbon member 8 is prepared as a separate member other than the members of the producing apparatus according to the related art which is used to form a film. The second embodiment differs from the first embodiment in that the satellite of the producing apparatus according to the related art is processed such that the carbon base 108 serving as a carbon supply source is exposed.

In the producing apparatus according to the second embodiment, similarly to the producing apparatus according to the first embodiment, an epitaxial material is deposited on the SiC substrate 11 while the SiC substrate 11 is maintained at a high temperature by heating means, such as a high-frequency coil provided below the mounting plate 2. In this way, an epitaxial film is formed.

At that time, carbon is generated from the carbon base 108. Since the counterbored portion 132a is covered with the SiC substrate 11, the generated carbon is emitted from the gap between the supporting portions 133. As such, the generated carbon is supplied to the outer circumferential portion (that is, the upstream side of the flow of the raw material gas 5) of the SiC substrate 11. Therefore, it is possible to increase the ratio of C/Si in the outer circumferential portion of the SiC epitaxial film 12.

(Third Embodiment)

A producing apparatus according to a third embodiment differs from the producing apparatus 1 according to the first embodiment in that the carbon supply source is not provided in the vicinity of the satellite, but is provided between the satellite and a gas inlet which is on the upstream side of the flow of a raw material gas. The other structures are the same as those in the producing apparatus 1 according to the first embodiment.

The producing apparatus according to the third embodiment includes a mounting plate 202 having a concave accommodation portion, a satellite 203 that is provided in the concave accommodation portion and has an upper surface on which a SiC substrate 11 is placed, a raw material gas introduction pipe 204 for supplying a raw material gas 5 for a SiC epitaxial film 12 onto a main surface 11a of the SiC substrate 11 placed on the satellite 203, and a carbon member 208 that is provided on the upstream side of the flow of the raw material gas 5 between a gas inlet of the raw material gas introduction pipe 204 and the satellite 203.

Figure 6:
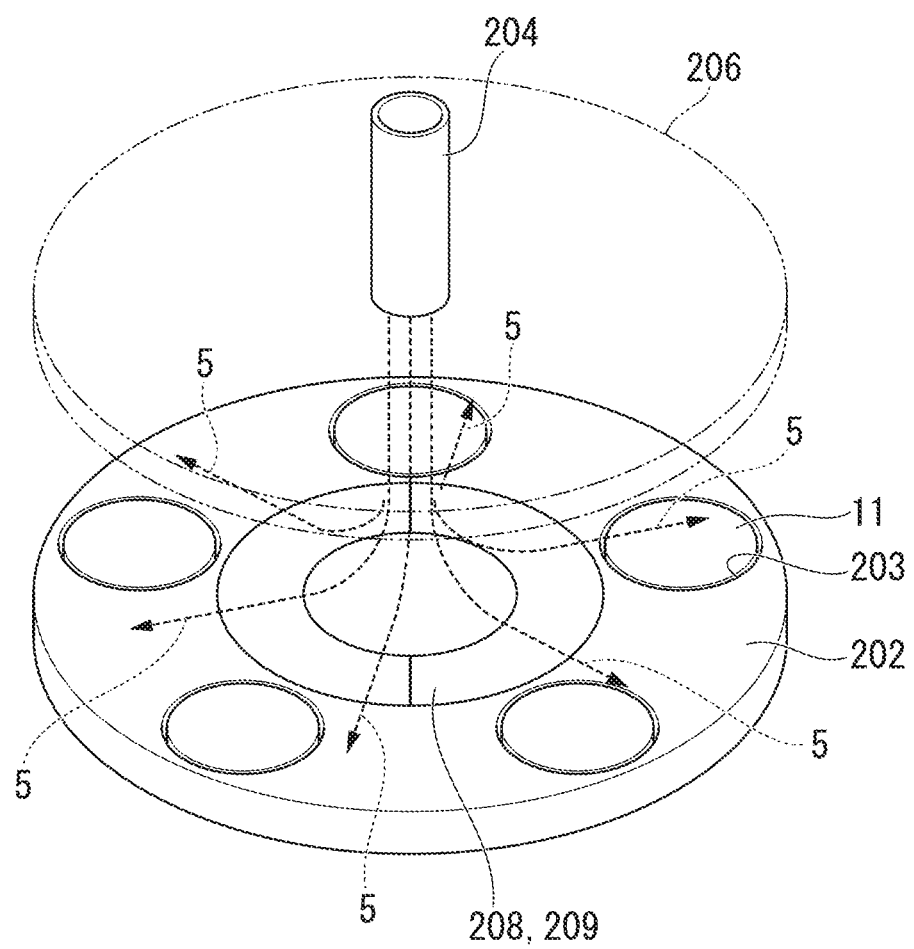
FIG. 6 is a diagram schematically illustrating a SiC epitaxial wafer-producing apparatus according to a third embodiment of the invention which is another example of the apparatus that grows a SiC epitaxial film on a main surface of a SiC substrate using a CVD method.

FIG. 6 is a diagram schematically illustrating an example of the producing apparatus according to the third embodiment. The producing apparatus according to the third embodiment illustrated in FIG. 6 is a modification example of the producing apparatus 1 according to the first embodiment illustrated in FIG. 1.

For example, the mounting plate 202 and the satellite 203 can be the same as those in the first embodiment. A ceiling 206 is represented by a dotted line for ease of understanding.

The carbon member 208 is provided on the upstream side of the flow of the raw material gas 5 between the gas inlet of the raw material gas introduction pipe 204 and the satellite 203. When the carbon member 208 is provided in this range, carbon that is generated during deposition is supplied to the outer circumferential portion (that is, the upstream side) of the SiC epitaxial film 12 by the flow of the raw material gas 5. Therefore, it is possible to suppress a variation in the range of C/Si in gas in the surface of the SiC epitaxial film 12 due to the difference between the decomposition speeds of components forming the raw material gas 5. As such, the dependence of the ratio of C/Si in gas in the entire surface of the SiC epitaxial film 12 on the position is reduced and a variation in the carrier concentration of the SiC epitaxial film 12 is reduced.

In general, a cover member 209 is provided on the surface of the mounting plate 202. Epitaxial growth occurs in a portion other than the surface of the SiC substrate 11. The cover member 209 is used to easily replace the film deposited on the mounting plate 202 when deposition is performed a plurality of times.

Therefore, it is preferable that a portion of the cover member 209 be made of carbon and function as the carbon member 208. In this case, it is not necessary to newly form a space in which a separate carbon member is provided and this structure can also be easily applied to the apparatus according to the related art.

(Fourth Embodiment)

A producing apparatus according to a fourth embodiment differs from the producing apparatus according to the first embodiment in that the substrate-holding ring 9 includes a carbon member. The other structures are the same as those in the producing apparatus 1 according to the first embodiment.

Figure 7:
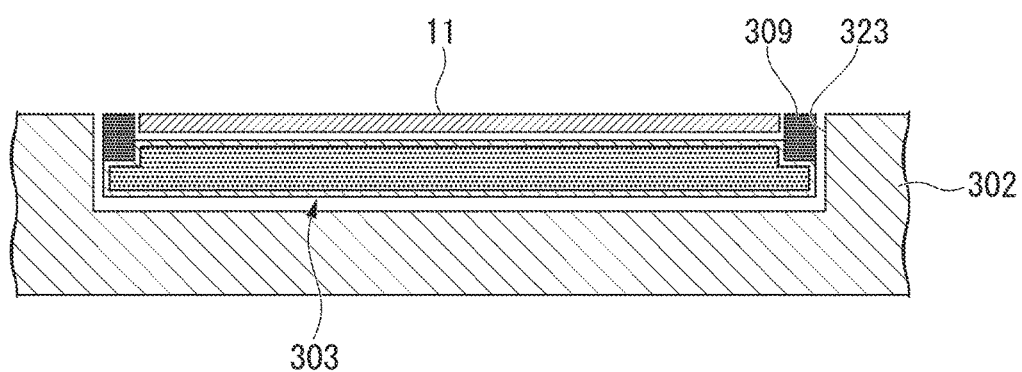
FIG. 7 is a cross-sectional view schematically illustrating an example of the arrangement of a carbon member provided in a SiC epitaxial wafer-producing apparatus according to a fourth embodiment of the invention and illustrates a concave accommodation portion of a susceptor and a satellite portion in which a SiC substrate is placed on a satellite.

FIG. 7 is a diagram schematically illustrating an example of the producing apparatus according to the fourth embodiment. The producing apparatus according to the fourth embodiment includes a mounting plate 302 having a concave accommodation portion, a satellite 303 that is provided in a concave accommodation portion 323 and has an upper surface on which a SiC substrate 11 is placed, and a substrate-holding ring 309 that has an opening portion having substantially the same size as the SiC substrate 11, is provided so as to surround a side surface of the SiC substrate 11, and is made of a carbon material.

In the fourth embodiment, the substrate-holding ring 309 is made of a carbon material and is used as a carbon supply source. Only the ring for holding the SiC substrate 11 placed on the satellite 303 may change to a carbon member and this structure can also be easily applied to the apparatus according to the related art.

It is preferable that, in the substrate-holding ring 309 made of a carbon material, only the surface on the side of the raw material gas 5 be covered with a coating film. It is preferable that the coating film be made of, for example, SiC or TaC. According to the structure in which the surface of the substrate-holding ring 309 is covered, even if an epitaxial film is grown on the substrate-holding ring 309 made of a carbon material during epitaxial growth, the grown film does not hinder the supply of carbon. Therefore, it is possible to supply a constant amount of carbon over time.

Since the substrate-holding ring 309 is made of a carbon material, carbon is generated during deposition. Since the substrate-holding ring 309 made of a carbon material is provided in an outer circumferential portion of the SiC substrate 11, the generated carbon is supplied to the outer circumferential portion (that is, the upstream side of the flow of the raw material gas 5) of the SiC substrate 11 and it is possible to increase the ratio of C/Si in gas in the vicinity of the outer circumferential portion of the SiC epitaxial film 12. Therefore, a variation in the ratio of C/Si in the surface of the SiC epitaxial film 12 due to the difference between the decomposition speeds of the components forming the raw material gas 5 is suppressed. As such, the dependence of the ratio of C/Si in gas in the entire surface of the SiC epitaxial film 12 on the position is reduced and a variation in the carrier concentration of the SiC epitaxial film 12 is reduced.

It is considered that, when the satellite 303 rotates on its axis, the side surface of the SiC substrate 11 comes into contact with the substrate-holding ring 309 made of a carbon material and is contaminated. However, since the contamination remains on the side surface, most of the surface of the SiC epitaxial film 12 can be used as a SiC epitaxial film with a uniform carrier concentration.

(Operation and Effect)

The SiC epitaxial wafer-producing apparatus 1 according to the invention has a structure in which the carbon supply source is provided so as not to come into contact with the rear surface of the SiC substrate 11 and a carbon atom supply member (a carbon member, a carbon base, or a substrate-holding ring made of a carbon material) supplies carbon to the upstream side of the flow of the raw material gas 5 supplied from the gas supply portion 4. Then, control is performed such that the ratio of C/Si increases in the outer circumferential portion of the SiC epitaxial film 12 grown on the SiC substrate 11. Therefore, it is possible to suppress a variation in carrier concentration in the surface of the SiC epitaxial film 12. As a result, it is possible to effectively uniformize the carrier concentration in the surface of a wafer, using an apparatus with a simple structure, without providing special facilities, and to produce a SiC epitaxial wafer 10 having excellent electrical characteristics with high productivity.

<SiC Epitaxial Wafer>

As illustrated in FIGS. 2A and 2B, the SiC epitaxial wafer produced by the SiC epitaxial wafer-producing apparatus or the SiC epitaxial wafer-producing method according to the invention is obtained by forming the SiC epitaxial film 12 on the main surface 11a of the SiC substrate 11 and is used in various semiconductor devices. The main surface 11a may be a C-plane or a Si-plane. The C-plane is less likely to be affected by the ratio of C/Si than the Si-plane during doping, which makes it difficult to obtain a wafer with a uniform carrier concentration. The method according to the invention, which controls the ratio of C/Si to improve carrier concentration, has a more remarkable effect in the C-plane than in the Si-plane.

[SiC Substrate]

The SiC substrate 11 used in the SiC epitaxial wafer can be produced by grinding the outer circumference of a SiC bulk single crystal ingot produced by, for example, a sublimation method in a cylindrical shape, slicing the SiC bulk single crystal ingot in a disk shape, using a wire saw, and chamfering an outer circumferential portion of the sliced ingot such that the sliced ingot has a predetermined diameter. At that time, the SiC bulk single crystal may be any polytype. 4H—SiC can be generally used as the SiC bulk single crystal for producing a practical SiC device.

Finally, mirror surface polishing is performed on the surface of the disk-shaped SiC substrate 11 obtained by slicing. First, the surface of the disk-shaped SiC substrate 11 is polished by a known mechanical polishing method to roughly remove an uneven portion of the polished surface and to adjust parallelism. Then, the surface of the SiC substrate polished by the mechanical polishing method is mechanically and chemically polished by a chemical mechanical polishing (CMP) method and the SiC substrate 11 with a mirror surface is obtained. At that time, only one surface (main surface) of the SiC substrate 11 may be polished into a mirror surface or both surfaces thereof may be polished into mirror surfaces.

Waviness or processing distortion which occurs when the ingot is sliced is removed from the SiC substrate 11 and the surface of the substrate is changed into a flat mirror surface by the surface-polishing process. The SiC substrate 11, of which the surface has been polished into a mirror surface, has very high flatness. In a wafer obtained by forming various epitaxial films on the SiC substrate 11, each layer has excellent crystal characteristics.

The thickness of the SiC substrate 11 is not particularly limited and can be in the range of, for example, about 300 μm to 800 μm.

The off-angle of the SiC substrate 11 is not particularly limited and may have any off-angle. For example, the SiC substrate 11 can have a small off-angle of 4° to 8° in order to reduce costs.

The inventors paid attention to a variation in carrier concentration in the surface of the SiC epitaxial film in order to improve the physical characteristics (for example, electrical characteristics) of the SiC epitaxial wafer. The inventors found that reducing a variation in the ratio of C/Si in gas in the entire surface of the substrate was effective in reducing a variation in the carrier concentration of the SiC epitaxial film when the SiC epitaxial film was formed.

In a SiC epitaxial wafer according to the related art in which a SiC epitaxial film was formed by, for example, a CVD method, a variation in the carrier concentration of the SiC epitaxial film was about 30% even in a case in which the Si-plane was used. It was found that the variation in the carrier concentration was mainly caused by the structure of a deposition apparatus (producing apparatus) or deposition conditions (deposition method) and depended on a variation in the ratio of C/Si between a central portion and an outer circumferential portion of the wafer when the SiC epitaxial film was formed. That is, it was found that, when the ratio of C/Si in the SiC epitaxial film was controlled to reduce a variation in the ratio of C/Si in the surface of the SiC epitaxial film, it was possible to uniformize the carrier concentration in the surface of the SiC epitaxial film.

In a case in which the Si-plane is used, a variation in the carrier concentration in the surface of the SiC epitaxial film 12 is equal to or less than 10% of a variation in the carrier concentration in the central portion. In the case of the C-plane, it is difficult to obtain an epitaxial wafer with higher in-plane uniformity than in the case of the Si-plane. However, it is possible to improve in-plane uniformity to the same level as that in the case of the Si-plane. When the variation in the carrier concentration is equal to or less than the above-mentioned value, excellent electrical characteristics are stably obtained during the formation of various devices using the SiC epitaxial wafer.

For example, aluminum or nitrogen can be used as a dopant added to the SiC epitaxial wafer in order to control electrical resistance. Nitrogen selectively enters a carbon site of SiC and becomes a donor. Aluminum enters a silicon site and becomes an acceptor. The dependence of the doping concentration of nitrogen on the ratio of C/Si is reverse to the dependence of the doping concentration of aluminum on the ratio of C/Si. However, both aluminum and nitrogen depend on the ratio of C/Si. It is preferable that the carrier concentration be in the range of $1 \times 10^{14}$ cm$^3$ to $1 \times 10^{18}$ cm$^3$, considering, for example, electrical characteristics after a device is formed.

The thickness of the entire SiC epitaxial wafer is not particularly limited.

The thickness of the SiC epitaxial film 12 of the SiC epitaxial wafer is not particularly limited. For example, in a case in which epitaxial growth is performed at a growth speed of about 4 μm/h in the general growth speed range, when deposition is performed for 2.5 hours, the thickness of the SiC epitaxial film 12 is about 10 μm.

<SiC Epitaxial Wafer-producing Method>

In the SiC epitaxial wafer-producing method according to the invention, the substrate-holding ring made of the carbon member, the carbon base, or the carbon material described in the first to fourth embodiments (FIGS. 1 to 7) is provided in the SiC epitaxial wafer-producing apparatus and the SiC epitaxial film 12 is grown on the main surface 11a of the SiC substrate 11 by a chemical vapor deposition method.

The producing method will be described in detail with reference to FIG. 2A. The producing method includes at least an epitaxial step of supplying the raw material gas 5 onto the main surface 11a of the SiC substrate 11 placed on the satellite 3 to grow the SiC epitaxial film 12. The carbon member 8 is provided as a supply source that supplies carbon to the upstream side of the flow of the raw material gas 5, that is, the F1 side of the arrow F illustrated in FIG. 2A. In the epitaxial step, the SiC epitaxial film 12 is grown while control is performed such that the ratio of C/Si in the outer circumferential portion of the SiC epitaxial film 12 increases.

[Preparation of SiC Substrate]

First, when the SiC substrate 11 is prepared, a SiC bulk single crystal ingot is prepared and the outer circumference of the ingot is ground into a cylindrical ingot. Then, the ingot is sliced in a disk shape by, for example, a wire saw and an outer circumferential portion of the sliced ingot is chamfered to obtain the SiC substrate 11 with a predetermined diameter. At that time, for example, a SiC bulk single crystal growth method, an ingot grounding method, and a slicing method are not particularly limited and known methods can be used.

[Step of Roughly Polishing SiC Substrate]

Then, in a rough polishing step, the main surface 11a of the SiC substrate 11 before an epitaxial layer, which will be described below, is formed is polished by a mechanical polishing method.

Specifically, for example, a polishing process which removes an uneven portion, such as relatively large waviness or processing distortion, in the main surface 11a of the SiC substrate 11 is performed by a mechanical polishing method such as lap polishing. At that time, a lap polishing method using a known lap polishing apparatus can be used which holds a SiC substrate on a carrier plate, supplies slurry, and rotates a platen while moving the carrier plate in a planetary manner, thereby polishing one surface of the SiC substrate or both surfaces thereof including the rear surface at the same time.

In the above description, the method which performs rough polishing using the above-mentioned lap polishing is given as an example of the step of roughly polishing the SiC substrate 11. For example, a method may be used which performs precise polishing, using a polish, to each surface of the SiC substrate 11 with ultraprecision after the lap polishing. Alternatively, in the lap polishing, precise polishing may be performed using minute diamond slurry in which the average particle size of secondary particles is approximately 0.25 μm (250 nm) and which is also used in a polish. The rough polishing process for the SiC substrate may be performed a plurality of times.

[Step of Planarizing SiC Substrate]

Then, in a planarizing step, ultraprecision polishing (mirror surface polishing) is performed for the SiC substrate 11, in which unevenness and parallelism have been adjusted in the rough polishing step, by a CMP method to planarize the main surface 11a of the SiC substrate 11. At that time, the main surface 11a of the SiC substrate 11 before an epitaxial layer is formed can be polished by the same apparatus as that used in the rough polishing step.

[Epitaxial Step]

Then, in an epitaxial step, the SiC epitaxial film 12 is grown on the planarized main surface 11a of the SiC substrate 11. In the epitaxial step, specifically, the SiC epitaxial film 12 for forming a semiconductor device is grown on the main surface 11a of the SiC substrate 11 by a known CVD method.

In the epitaxial step, a carbon member or a carbon base serving as a supply source that supplies carbon to the raw material gas 5 is provided. For example, the SiC epitaxial film 12 can be formed by the SiC epitaxial wafer-producing apparatuses 1 according to the invention illustrated in FIGS. 1 to 7.

First, the SiC substrate 11 is placed on the satellite 3 in the producing apparatus 1, with the main surface 11a up.

Then, while the susceptor 2 and the satellite 3 are rotated to rotate the SiC substrate 11 on its axis, the raw material gas 5 is supplied from the raw material gas introduction pipe 4 together with carrier gas. At that time, gas including a carbon hydride-based gas and a silane-based gas, which is used to form a SiC epitaxial film in the related art, is used as the raw material gas 5. For example, gas including $C_3H_8$ can be used as the carbon hydride-based gas and gas including $SiH_4$ can be used as the silane-based gas. In addition, hydrogen can be introduced as the carrier gas and nitrogen can be introduced as dopant gas.

The mole ratio of C/Si in the raw material gas 5 may be, for example, in the range of about 0.5 to 2.0. Gas including hydrogen is preferably used as the carrier gas and hydrogen is more preferable. A flow rate can be appropriately determined according to the apparatus used.

As epitaxial growth conditions, for example, the growth speed of the SiC epitaxial film 12 is equal to or greater than 1 μm/h, a growth temperature is in the range of 1000° C. to 1800° C., preferably in the range of 1300° C. to 1700° C., and more preferably in the range of 1400° C. to 1600° C. Atmospheric pressure is preferably reduced pressure and can be equal to or less than 300 Torr. The atmospheric pressure is more preferably in the range of 50 Torr to 250 Torr. The growth speed of the SiC epitaxial film 12 can be in the range of 2 μm/h to 30 μm/h.

In the SiC epitaxial wafer-producing method, as described in the producing apparatus, in the epitaxial step, a carbon member or a carbon base is provided which is a supply source that supplies carbon to the upstream side of the flow of the raw material gas 5 (that is, the F1 side of the arrow F illustrated in FIG. 2A). Therefore, the SiC epitaxial film 12 is grown while control is performed such that the ratio of C/Si in the outer circumferential portion of the SiC epitaxial film 12 increases. As a result, it is possible to uniformize the ratio of C/Si in the surface of the SiC epitaxial film 12.

In the epitaxial step of the invention, graphite and $H_2$, which are materials forming the carbon member, the carbon base, or the substrate-holding ring made of the carbon material, come into contact with each other at a high temperature. As a result, carbon hydride is generated. Therefore, the raw material gas and the carbon hydride which is supplied from the carbon member, the carbon base, or the substrate-holding ring made of the carbon material are supplied to the upstream side of the flow of the raw material gas 5 at the same time. Since the carbon hydride is gas including C, it is possible to effectively supply carbon to the upstream side of the flow of the raw material gas 5. It is known that a solid carbon member reacts with hydrogen to generate carbon hydride. However, the degree of influence of carbon hydride, which is generated at the temperature used in the epitaxial growth of SiC, on a change in the ratio of C/Si and a change in carrier concentration due to the change in the ratio of C/Si has not been checked and there has been no attempt to use the generation of carbon hydride for controlling the carrier concentration distribution of the SiC epitaxial wafer. It is necessary to arrange the carbon member in the vicinity of the wafer in order to use the generation of carbon hydride for controlling the carrier concentration distribution. However, when a carbon member which is not coated with a film is used, there is a concern that carbon which has deteriorated will have an adverse effect on epitaxial growth. For this reason, it is necessary to arrange the carbon member at a position that is effective in controlling the carrier concentration distribution of the SiC epitaxial wafer and is not adversely affected by carbon, in order to control the carrier concentration distribution using the above-mentioned principle.

In the epitaxial step of the SiC epitaxial wafer-producing method, control is performed such that the ratio of C/Si in the outer circumferential portion of the SiC epitaxial film 12 increases. At that time, preferably, control is performed such that the effective ratio of C/Si in the entire epitaxial wafer including the outer circumferential portion is in the range of 0.5 to 2.0.

When the ratio of C/Si in the outer circumferential portion of the SiC epitaxial film 12 increases in the above-mentioned range, the carrier concentration of this area is reduced. Therefore, a variation in the carrier concentration in the surface of the SiC epitaxial film 12 is suppressed and a uniform carrier concentration distribution is obtained.

When the ratio of C/Si in the outer circumferential portion is controlled in the range of 0.5 to 2.0, a variation in the carrier concentration in the surface of the SiC epitaxial film 12 can be controlled to be equal to or less than 10% of a variation in the carrier concentration of the central portion. Therefore, it is possible to form the SiC epitaxial film 12 with a uniform carrier concentration in the surface thereof.

(Operation and Effect)

A SiC epitaxial wafer 10 that has a uniform carrier concentration in the surface of the SiC epitaxial film 12 and has excellent electrical characteristics can be produced by each of the above-mentioned steps.

The preferred embodiments of the invention have been described above. However, the invention is not limited to a specific embodiment and various modifications and changes to the invention can be made without departing from the scope and spirit of the invention described in the claims.

EXAMPLES

Hereinafter, the effect of the invention will be described in detail with reference to examples. The invention is not limited to these examples.

In the examples, when a SiC epitaxial film was grown, the carrier concentration distribution of the SiC epitaxial film was examined in a radial direction of the SiC epitaxial wafer in a case in which a producing apparatus including a carbon member was used and in a case in which a producing apparatus without a carbon member was used.

Example 1

In Example 1, first, lap polishing was performed on the C-plane, which was a main surface of a SiC substrate (6 inches, 4H—SiC-4°-off substrate), using diamond slurry in which the average particle size of secondary particles was 0.25 μm, and then CMP polishing was performed on the SiC substrate.

In SiC epitaxial growth on the C-plane, since the carrier concentration is greatly affected by the ratio of C/Si, a variation in carrier concentration distribution is large. In this example, a C-plane wafer was used in order to significantly improve the carrier concentration distribution using the carbon member.

Then, a SiC epitaxial film was formed with a thickness of 5 μm on the polished main surface (C-plane) of the SiC substrate by the producing apparatus (CVD apparatus) illustrated in FIG. 1. At that time, the SiC substrate was placed on the satellite provided on the susceptor and raw material gas and carrier gas were supplied while the SiC substrate was rotated on its axis.

At that time, deposition conditions were as follows: a growth temperature was 1600° C.; hydrogen was used as the carrier gas; nitrogen was used as dopant gas; propane was used as C raw material gas; silane was used as a Si raw material gas; and the ratio of C/Si was 1.1.

In this example, the satellite according to the first embodiment illustrated in FIGS. 2A and 2B was used. That is, the carbon member 8, which is a carbon supply source, is located at the position that is lower than the SiC substrate and does not come into contact with the SiC substrate and the carbon member 8 is covered with the ring-shaped member 9.

At that time, ultrapure graphite was used as the carbon member 8. Commercially available ultrapure graphite included the following impurities: about 0.1 ppm wt of B; about 0.0.001 ppm wt or less of Mg; about 0.001 ppm wt or less of Al; about 0.001 ppm wt or less of Ti; about 0.001 ppm wt or less of V; about 0.004 ppm wt or less of Cr; about 0.02 ppm wt or less of Fe; and about 0.001 ppm wt or less of Ni. In addition, the ultrapure graphite was backed to remove nitrogen. Therefore, few elements other than carbon are supplied.

Figure 8A:
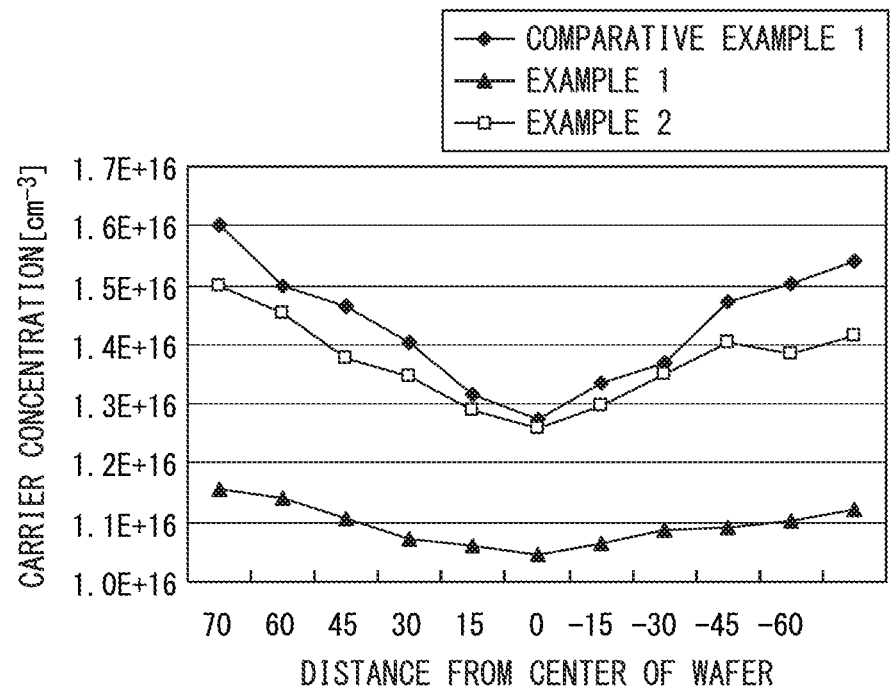
FIGS. 8A and 8B are diagrams illustrating Examples 1 and 2 according to the invention.
Figure 8B:
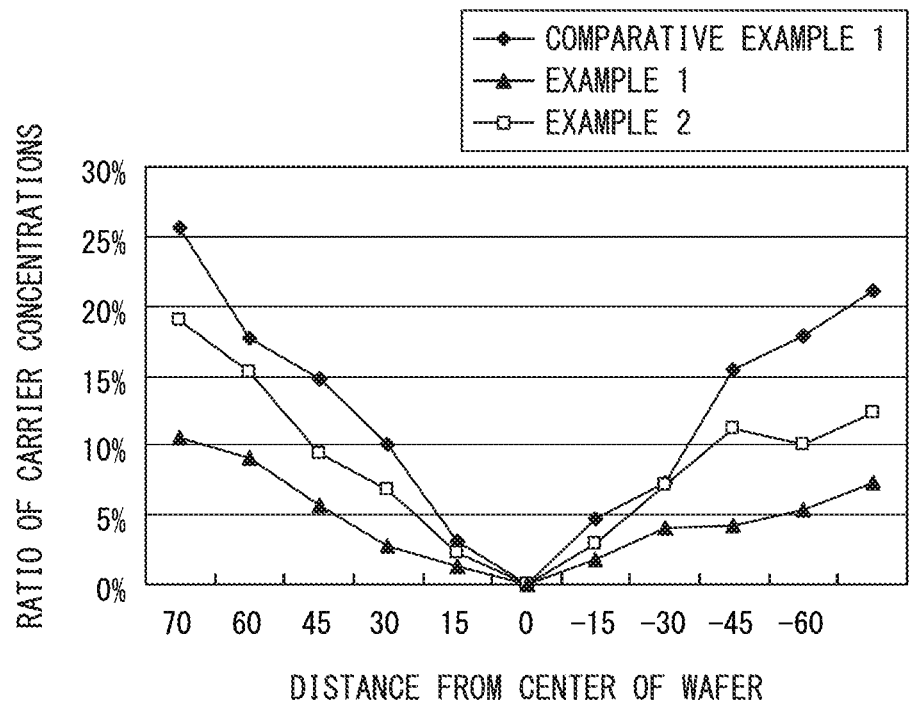

Then, the carrier concentration of the SiC epitaxial wafer which was obtained by the above-mentioned process and in which the SiC epitaxial film was formed on the main surface of the SiC substrate was measured at a pitch of 10 mm by a CV measurement device in the radial direction of the SiC epitaxial wafer, that is, in a direction from one outer circumferential end to the other outer circumferential end through the center. The measurement results are illustrated in the graphs of FIGS. 8A and 8B. FIG. 8A is a graph illustrating a carrier concentration distribution of the SiC epitaxial wafer in the radial direction and FIG. 8B is a graph illustrating the ratio of the carrier concentration of the SiC epitaxial wafer in the radial direction to the carrier concentration of the wafer at the center.

Example 2

In Example 2, the satellite according to the second embodiment illustrated in FIGS. 4A and 4B were used. That is, a SiC epitaxial wafer was produced by the same process and under the same conditions as those in Example 1 except that the carbon base 118 in which the entire bottom of the counterbored portion 132a was exposed was used as the carbon supply source.

Then, the carrier concentration of the SiC epitaxial wafer was measured at a pitch of 10 mm by the same method as that in Example 1 in the radial direction, that is, in a direction from one outer circumferential end to the other outer circumferential end through the center. The measurement results are illustrated in the graphs of FIGS. 8A and 8B.

Comparative Example 1

In Comparative Example 1, a SiC epitaxial wafer was produced by the same process and under the same conditions as those in Example 1 except that a producing apparatus without a carbon member was used.

Then, the carrier concentration of the SiC epitaxial wafer was measured at a pitch of 10 mm by the same method as that in Example 1 in the radial direction, that is, in a direction from one outer circumferential end to the other outer circumferential end through the center. The measurement results are illustrated in the graphs of FIGS. 8A and 8B.

[Evaluation Results]

As can be seen from the graphs illustrated in FIGS. 8A and 8B, in the SiC epitaxial wafers according to Examples 1 and 2 obtained by forming the SiC epitaxial film on the main surface of the SiC substrate while supplying carbon to the upstream side of the flow of the raw material gas, using the producing apparatus according to the invention, the carrier concentration of the entire surface is more uniform than that in Comparative Example 1.

In Comparative Example 1, the carrier concentration is relatively low in the vicinity of the center of the wafer and is very high in the outer circumferential portion (in the vicinity of the edge) of the wafer, which shows that the carrier concentration in the surface of the SiC epitaxial film is very non-uniform.

In contrast, in Examples 1 and 2, a variation in the carrier concentration was less than that in Comparative Example 1. As illustrated in FIG. 8B, in Comparative Example 1, a variation in the carrier concentration (the difference in carrier concentration between a central portion and an outer circumferential portion) was equal to or greater than 25%. However, in Example 1, a variation in the carrier concentration was equal to or less than 20%. In Example 2, a variation in the carrier concentration was about 10%.

In particular, in Example 1, the carrier concentration in the entire surface was controlled to be lower than that in Comparative Example 1. In particular, the carrier concentration was significantly reduced in the outer circumferential portion of the wafer.

From the above-mentioned results, the following is considered: the reason why the carrier concentration is reduced in, particularly, the outer circumferential portion of the SiC epitaxial wafer produced in Examples 1 and 2 is that, when the SiC epitaxial film is formed under the conditions in which carbon is supplied to the upstream side of the flow of the raw material gas, the ratio of C/Si in the outer circumferential portion of the wafer located on the upstream side of the flow of gas increases and the carrier concentration at that position is reduced.

Example 3

In Example 3, first, lap polishing was performed on the C-plane, which was a main surface of a SiC substrate (4 inches, 4H—SiC-4°-off substrate), using diamond slurry in which the average particle size of secondary particles was 0.25 μm, and then CMP polishing was performed on the SiC substrate.

Then, a SiC epitaxial film was formed with a thickness of 5 μm on the polished main surface (C-plane) of the SiC substrate by the producing apparatus (CVD apparatus) illustrated in FIG. 6. At that time, the SiC substrate was placed on the satellite provided on the susceptor and raw material gas and carrier gas were supplied while the SiC substrate was rotated on its axis. The deposition conditions were the same as those in Example 1.

In this example, the cover member 209 arranged in the vicinity of the gas introduction member 204 illustrated in FIG. 6 was made of carbon as described in the third embodiment. The SiC epitaxial film was grown while carbon was supplied from the cover member 209 made of carbon to the upstream side of the flow of the raw material gas. The quality of carbon forming the cover member was the same as that of carbon forming the carbon member in Example 1.

Figure 9A:
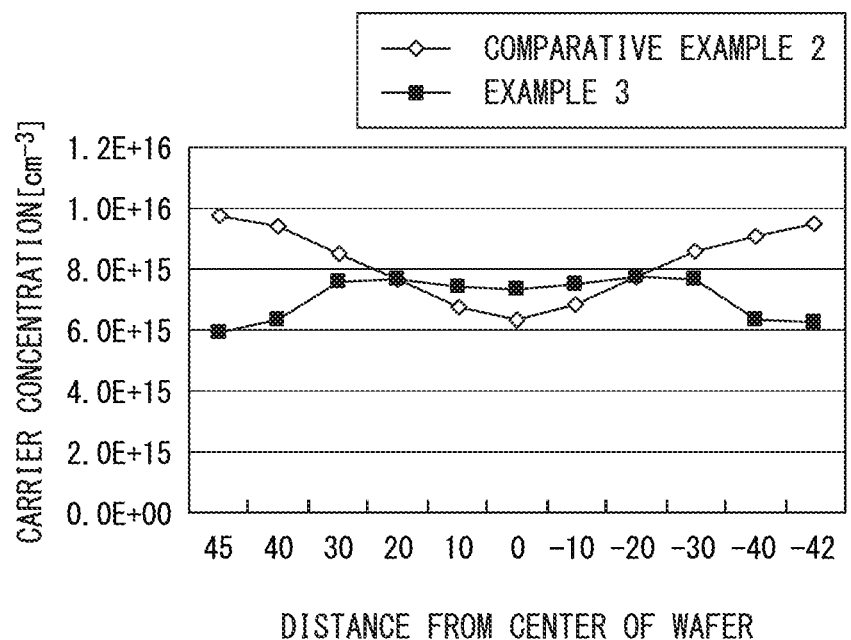
FIGS. 9A and 9B are diagrams illustrating Example 3 according to the invention.
Figure 9B:
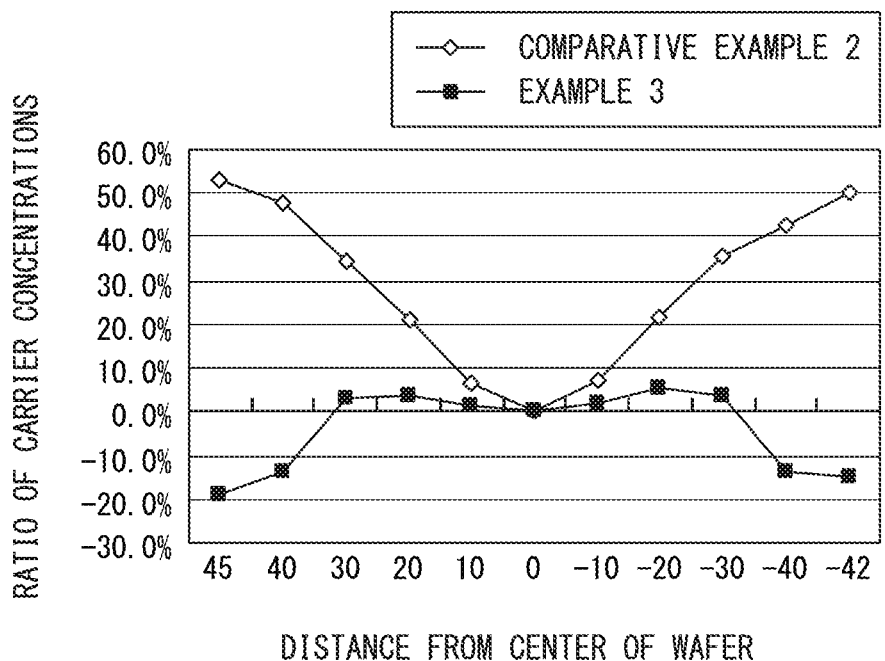
Figure 10:
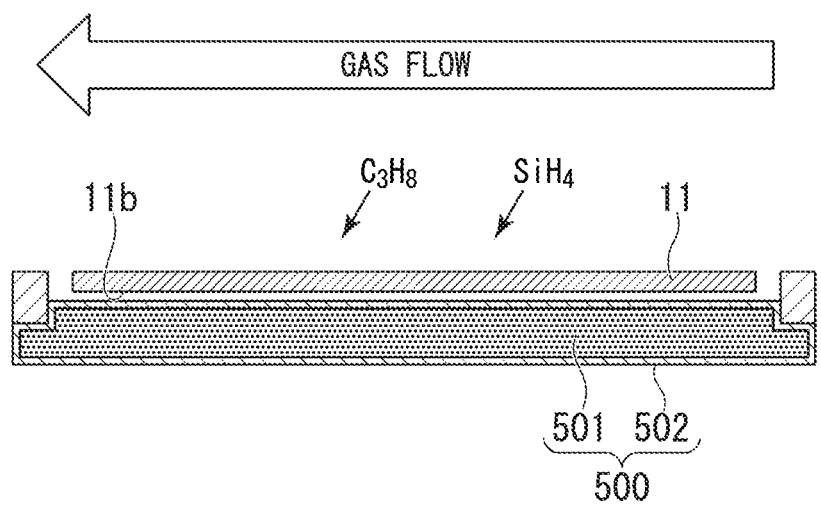
FIG. 10 is a diagram schematically illustrating a SiC epitaxial wafer-producing apparatus according to the related art.
Figure 11:
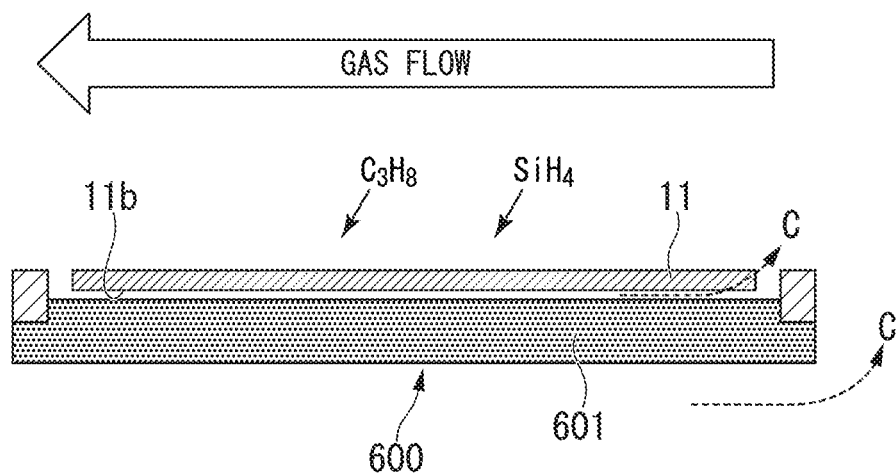
FIG. 11 is a diagram schematically illustrating a SiC epitaxial wafer-producing apparatus.

Then, the carrier concentration of the SiC epitaxial wafer was measured at a pitch of 10 mm by the same method as that in Example 1 in the radial direction, that is, in a direction from one outer circumferential end to the other outer circumferential end through the center. The measurement results are illustrated in the graphs of FIGS. 9A and 9B. FIG. 9A is a graph illustrating a carrier concentration distribution of the SiC epitaxial wafer in the radial direction and FIG. 9B is a graph illustrating the ratio of the carrier concentration of the SiC epitaxial wafer in the radial direction to the carrier concentration of the wafer at the center.

Comparative Example 2

In Comparative Example 2, a SiC epitaxial wafer was produced by the same process and under the same conditions as those in Example 3 except that a producing apparatus without a carbon member was used.

Then, the carrier concentration of the SiC epitaxial wafer was measured at a pitch of 10 mm by the same method as that in Example 1 in the radial direction from one outer circumferential end to the other outer circumferential end through the center. The measurement results are illustrated in the graphs of FIGS. 9A and 9B.
[Evaluation Results]

As can be seen from the graphs illustrated in FIG. 9B, in Comparative Example 2, a variation in the carrier concentration (the difference in carrier concentration between a central portion and an outer circumferential portion) was equal to or greater than 50%. However, in Example 3, a variation in the carrier concentration was equal to or less than 20%.

In Example 3, it is considered that, when the SiC epitaxial film is formed under the conditions in which carbon is supplied to the upstream side of the flow of the raw material gas, the ratio of C/Si in the outer circumferential portion of the wafer located on the upstream side of the flow of gas increases and the carrier concentration at that position is reduced.

INDUSTRIAL APPLICABILITY

According to the SiC epitaxial wafer-producing apparatus of the invention, it is possible to produce a SiC epitaxial wafer having excellent electrical characteristics with high productivity using a simple apparatus. For example, it is possible to produce a SiC epitaxial wafer used in power devices, high-frequency devices, and devices that operate at a high temperature.

REFERENCE SIGNS LIST

1: PRODUCING APPARATUS (SiC EPITAXIAL WAFER-PRODUCING APPARATUS)
2, 202, 302: SUSCEPTOR
2A: ROTATING SHAFT
2$a$: UPPER SURFACE
2$b$: LOWER SURFACE
21: BASE
22: COATING FILM
23, 323: CONCAVE ACCOMMODATION PORTION
28: CONCAVE PORTION
23$b$: BOTTOM
3, 103, 113, 203, 303: SATELLITE
31: BASE
32: COATING FILM
103$a$: UPPER SURFACE
113$a$: FRONT SURFACE
113$b$: REAR SURFACE
132$a$: COUNTERBORED PORTION
133: SUPPORTING PORTION
8, 18, 208: CARBON MEMBER
108, 118: CARBON BASE
4, 204: RAW MATERIAL GAS INTRODUCTION PIPE
6, 206: CEILING
11: SiC SUBSTRATE
11$a$: MAIN SURFACE
12: SiC EPITAXIAL FILM
5: RAW MATERIAL GAS
9, 309: SUBSTRATE-HOLDING RING
209: COVER MEMBER
F: FLOW OF RAW MATERIAL GAS (ARROW)
C: CARBON
F1: UPSTREAM SIDE (FLOW OF RAW MATERIAL GAS)

What is claimed is:

1. A SiC epitaxial wafer-producing apparatus that grows a SiC epitaxial film on a main surface of a SiC substrate using a chemical vapor deposition method, comprising:
   a mounting plate that has a concave accommodation portion;
   a satellite that is provided in the concave accommodation portion and has an upper surface on which the SiC substrate is placed;
   an annular carbon member that is provided in the concave accommodation portion at a position which is lower than the SiC substrate and does not come into contact with the SiC substrate, wherein the annular carbon member has an inside diameter that is greater than an outside diameter of the upper surface of the satellite; and
   a substrate-holding ring that has an opening portion having substantially the same size as the SiC substrate and is provided so as to surround a side surface of the SiC substrate,
   wherein the carbon member is provided below the substrate-holding ring, and
   wherein the substrate-holding ring is covered with a non-carbon material so as to prevent exposure of underlying material forming the substrate-holding ring.

2. The SiC epitaxial wafer-producing apparatus according to claim 1, wherein the carbon member is provided on the bottom of the concave accommodation portion.

3. A method for producing a SiC epitaxial wafer which comprises:
introducing a SiC substrate into the SiC epitaxial wafer-producing apparatus of claim 1, heating the SiC substrate, and supplying a raw material including a Si source, a carbon source, and a carrier material, to thereby grow a SiC epitaxial film on the SiC substrate, the carbon material member being an additional carbon source for growing the SiC epitaxial film.

4. The SiC epitaxial wafer-producing apparatus according to claim 1,
wherein the annular carbon member is provided on an upper surface of a radially outward step portion formed in an outer circumference of the satellite.

5. The SiC epitaxial wafer-producing apparatus according to claim 1,
wherein an upper surface of the substrate-holding ring is not higher than an upper surface of the SiC substrate.

6. The SiC epitaxial wafer-producing apparatus according to claim 1,
wherein an inner circumferential side surface of the annular carbon member is exposed so as to serve as a carbon source.

7. A SiC epitaxial wafer-producing apparatus that grows a SiC epitaxial film on a main surface of a SiC substrate using a chemical vapor deposition method, comprising:
a mounting plate that has a concave accommodation portion; and
a satellite that is provided in the concave accommodation portion and has an upper surface on which the SiC substrate is placed,
wherein the satellite includes a carbon base which is covered with a non-carbon material and a portion which is provided at a position that does not come into contact with the SiC substrate placed on the satellite and through which the carbon constituting the carbon base is exposed,
wherein the satellite includes a counterbored portion which is formed in a central portion of an upper surface thereof so as not to come into contact with the SiC substrate and a supporting portion which is provided so as to surround the counterbored portion and support the SiC substrate,
the carbon constituting the carbon base is exposed through at least a portion of the bottom of the counterbored portion and the at least portion of the bottom is the portion through which the carbon constituting the carbon base is exposed, and
the supporting portion is discretely provided so as to surround a part of but not an entire circumference of the counterbored portion.

8. The SiC epitaxial wafer-producing apparatus according to claim 7,
wherein the carbon base is exposed through at least a portion of a rear surface of the satellite and the at least portion of the rear surface is the portion through which the carbon base is exposed.

9. A method for producing a SiC epitaxial wafer which comprises:
introducing a SiC substrate into the SiC epitaxial wafer-producing apparatus of claim 7, heating the SiC substrate, and supplying a raw material including a Si source, a carbon source, and a carrier material, to thereby grow a SiC epitaxial film on the SiC substrate, the carbon base being an additional carbon source for growing the SiC epitaxial film.

* * * * *